(12) United States Patent
Kehlstadt

(10) Patent No.: US 6,859,196 B2
(45) Date of Patent: Feb. 22, 2005

(54) POINTING DEVICE WITH HAND DETECTION

(75) Inventor: Florian Max Kehlstadt, Aclens (CH)

(73) Assignee: Logitech Europe S.A., Romanel-sur-Morges (CH)

( * ) Notice: Subject to any disclaimer, the term of this patent is extended or adjusted under 35 U.S.C. 154(b) by 93 days.

(21) Appl. No.: 09/964,975

(22) Filed: Sep. 26, 2001

(65) Prior Publication Data

US 2002/0093481 A1 Jul. 18, 2002

Related U.S. Application Data

(60) Provisional application No. 60/261,543, filed on Jan. 12, 2001.

(51) Int. Cl.$^7$ ................................................ G09G 5/00
(52) U.S. Cl. ........................ 345/156; 345/158; 345/163; 341/33
(58) Field of Search ................................ 345/156, 158, 345/163, 165, 211, 212, 157, 173, 175; 341/20, 22, 33, 21; 400/472; 713/324, 322, 320, 301; 178/18.06

(56) References Cited

U.S. PATENT DOCUMENTS

| | | | |
|---|---|---|---|
| 5,707,160 A | * | 1/1998 | Bowen ........................ 400/472 |
| 5,785,439 A | * | 7/1998 | Bowen ........................ 400/472 |
| 5,952,835 A | * | 9/1999 | Coveley ...................... 324/671 |
| 6,075,520 A | * | 6/2000 | Inoue et al. ................. 345/173 |
| 6,105,142 A | * | 8/2000 | Goff et al. ................... 713/324 |
| 6,452,514 B1 | * | 9/2002 | Philipp ........................ 341/33 |
| 6,559,830 B1 | | 5/2003 | Hinckley et al. |
| 2001/0011995 A1 | * | 8/2001 | Hinckley et al. ........... 345/156 |
| 2002/0030668 A1 | * | 3/2002 | Hoshino et al. ............. 345/175 |
| 2002/0126094 A1 | * | 9/2002 | Junod et al. ................. 345/163 |
| 2003/0025679 A1 | * | 2/2003 | Taylor et al. ................ 345/175 |
| 2003/0058222 A1 | | 3/2003 | Casebolt et al. |
| 2003/0061524 A1 | | 3/2003 | Casebolt et al. |

FOREIGN PATENT DOCUMENTS

WO      WO 00/33245 A1     6/2000

* cited by examiner

*Primary Examiner*—Amare Mengistu
(74) *Attorney, Agent, or Firm*—Townsend and Townsend and Crew LLP.

(57) ABSTRACT

An input device having a housing and electronic circuitry for detecting user inputs, and transmitting signals corresponding to those inputs to an electronic device, such as a computer. A sleep mode is provided for the electronic circuitry to conserve power. A hand detection circuit is provided for detecting the proximity of a user's hand to the housing and producing a hand detect signal in response. The hand detect signal will awaken the input device from its sleep mode.

5 Claims, 7 Drawing Sheets

POINTING DEVICE WITH HAND DETECTION

CROSS-REFERENCE TO RELATED APPLICATIONS

This application claims priority from the provisional application of the same title filed Jan. 12, 2001, Application No. 60/261,543.

BACKGROUND OF THE INVENTION

The present invention relates to input devices, in particular pointing devices such as mice, and more particularly to sleep modes for such devices.

In many instances, it is desired to bring a pointing device into a power saving mode. For example, Universal Serial Bus (USB) specifications require a low power device in suspend mode to consume less than 500 uA overall. Similarly, a wireless, battery operated pointing device must limit its power consumption to a minimum when the user is either not present or not using the device. Two strategies have been applied to reach this goal, namely the interrupt approach and the activity monitoring approach.

The interrupt approach relies on the interrupt input found in the device microcontroller. This input, when asserted, activates built-in wake-up circuitry that brings the device back into an active mode, from an idle state in which power consumption is minimal. When the device is idle, the wake-up circuitry is active but requires a very small amount of power. In this configuration, the interrupt input is connected to a switch that the user must depress to activate (wake up) the device. In the activity monitoring approach, some monitoring activity is started in a periodic manner to verify that a user is not soliciting the device in any way. In a mouse, activity monitoring requires flashing the encoder Light Emitting Diodes (LEDs) and reading back the photo-detector signals in order to detect a potential horizontal movement, a rather power hungry task. If activity is detected, the device resumes an active state. In this approach, battery saving is obtained thanks to the long idle time between two activity monitoring periods. This approach is less effective than the former since monitoring typically requires more power than that required in the microcontroller idle state.

While the two approaches have proven to be very effective, both suffer from their own limitations. The interrupt approach limitation is the fact that a pointing device must be "wakened up" by clicking on a switch when in power saving mode, e.g. there is no automatic waking up when the user moves the pointing device as is currently the case in Logitech products. On the other hand, the monitoring approach doesn't require a clicking wake up action, but suffers from a rather long latency time when the device is in this monitoring mode, the shortening the latency time being in contradiction with the power saving objectives.

The problem of power consumption is particularly troublesome in the new mice using an optical module, which detects the reflection of light off a surface to determine mouse movement. When such a device is made wireless, requiring a transmitter (e.g., radio or infrared) as well, it is difficult to have the batteries last more than a couple of months. Accordingly, it is desirable to have an improved, automatic power saving mode.

As discussed below, the present invention provides such an improved power saving mode by using hand detection to activate an input device, such as a mouse. In one embodiment, the hand detection uses capacitive detection. Hand detection and capacitive detection have been used in other applications, a few of which are discussed below. For example, touchpads use capacitive detection to detect the location of a finger on a touchpad.

U.S. Pat. No. 5,341,036 is an example of hand detection being used to activate a system. In that patent, a machine operator control station is activated when both hands of the operator are detected on the control inputs.

U.S. Pat. No. 4,919,429 shows the detection of a hand by an optical beam being broken. The detection of the hand activates certain routines of a hand skill amusement game.

Capacitive switches have also been used in other applications, such as detecting the touch of a user on a lamp, and turning on the lamp.

SUMMARY OF THE INVENTION

The present invention provides an input device having a housing and electronic circuitry for detecting user inputs, and transmitting signals corresponding to those inputs to an electronic device, such as a computer. A sleep mode is provided for the electronic circuitry to conserve power. A hand detection circuit is provided for detecting the proximity of a user's hand to the housing and producing a hand detect signal in response. The hand detect signal will awaken the input device from its sleep mode.

One embodiment uses capacitive detection in a wireless device. The circuit uses a local ground, since true earth ground is not available for a wireless device. By using two electrodes, touched by the hand at the same time, and driving the circuits in opposite directions, earth ground can be simulated by the local ground. This requires placing the electrodes where they are easy and likely to be both touched by the hand at the same time. In one embodiment, two large electrodes are on the inside of the two halves of the top cover of a mouse, while two additional electrodes in parallel are on the two sides.

In an alternate embodiment, a computer mouse is provided with a housing and electronic circuitry for detecting the movement of the mouse, and providing signals to a computer. The mouse includes a hand detection circuit for detecting either the proximity of a user's hand to the mouse or the actual contact of the hand with the mouse. In response to the detected user's hand, a function is activated in either the mouse or the computer. In one embodiment, the function is waking up from a sleep mode. Other embodiments include activating a light in the mouse, and providing a message on a computer display.

For a further understanding of the nature and advantages of the invention, references should be made to the following description taken in conjunction with the accompanying drawings.

BRIEF DESCRIPTION OF THE DRAWINGS

FIGS. 3 and 4 are timing diagrams illustrating the charge up and discharge cycles for the first and second electrodes, respectively, with no hand and the hand on.

DESCRIPTION OF THE SPECIFIC EMBODIMENTS

Figure 1:
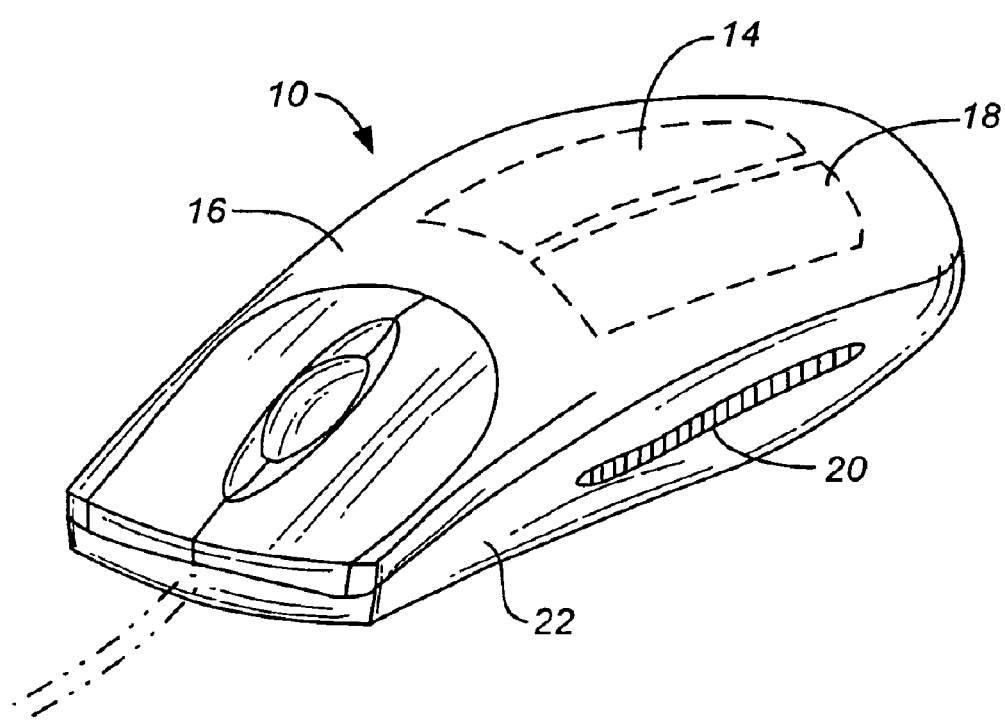
FIG. 1 is a perspective view of a mouse incorporating the capacitive hand detection electrodes according to an embodiment of the invention.

FIG. 1 illustrates a mouse 10 having a top housing cover 16 beneath which, in phantom, are shown sheet electrodes 14 and 18. Additionally, an exposed electrode 20 is shown on a side 22 of the mouse. A similar electrode can be mounted on the other side, not shown. The electrodes 14, 18, or/and 20, are connected to a capacitive detection circuit for detecting when a hand is touching or in close proximity to those electrodes.

Figure 2A:
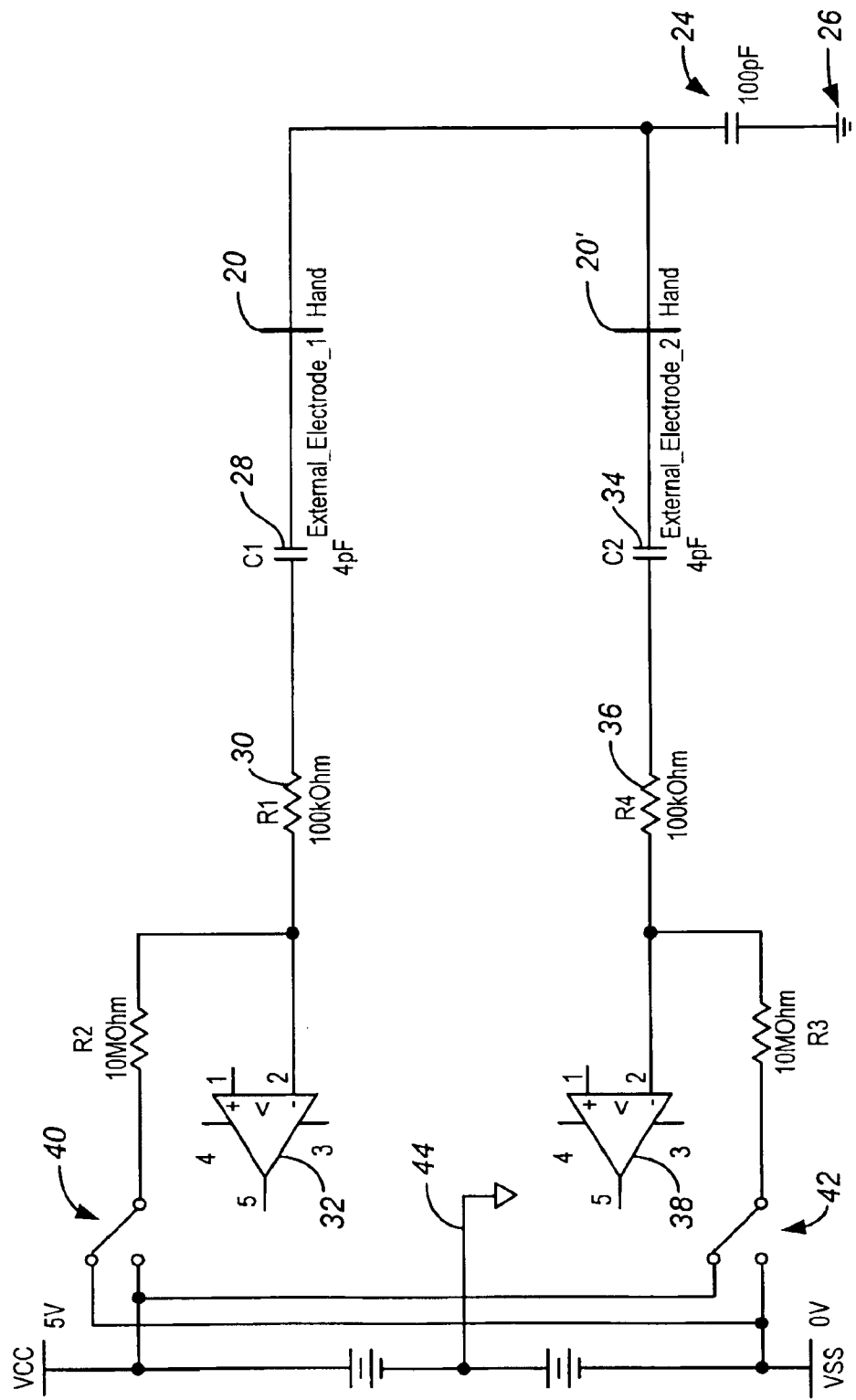
FIGS. 2A and 2B illustrate the capacitive hand detection circuit embodiment for direct and indirect coupling of the hand, respectively.

FIG. 2A illustrates, at a high level, the operation of the capacitive detection circuit. FIG. 2A illustrates a direct connection from the hand to the detection circuit, such as through exposed electrode 20 and a corresponding second electrode 20'. When the hand touches these, the capacitance of the body 24 to an earth ground 26 is connected in series with the electrodes. As shown, first electrode 20 is connected through a capacitor 28 and a resistor 30 to one input of a comparator 32. Similarly, the second electrode 20' is connected through a capacitor 34 and a resistor 36 to another comparator 38. The inputs to the comparators are compared to a reference threshold to determine how long it takes for the capacitance connected to the measurement node to charge or discharge. As shown, a switch 40 connects the measurement node of comparator 32 to either ground (Vss) or to the positive voltage supply (Vcc). Similarly, a switch 42 connects the measurement node of comparator 38 to the same references.

However, switches 40 and 42 operate to connect one comparator to Vcc, while the other comparator is connected to Vss, and vice versa. Thus, one electrode and its capacitance will be charging up, while the other one is discharging. This simultaneous measurement in opposing directions provides that an internal virtual ground 44 will mimic the earth ground, allowing the detection of the user's hand, which user is naturally capacitively coupled to the real earth ground. The capacitance measured when the user's hand is in proximity to the electrodes is contrasted with the capacitance when the user's hand is not near. Without the user's hand, there is no connection to earth ground 26, and the electrodes are floating. Thus, the only capacitance is parasitic capacitance to the internal virtual ground 44 of the device.

Figure 2B:
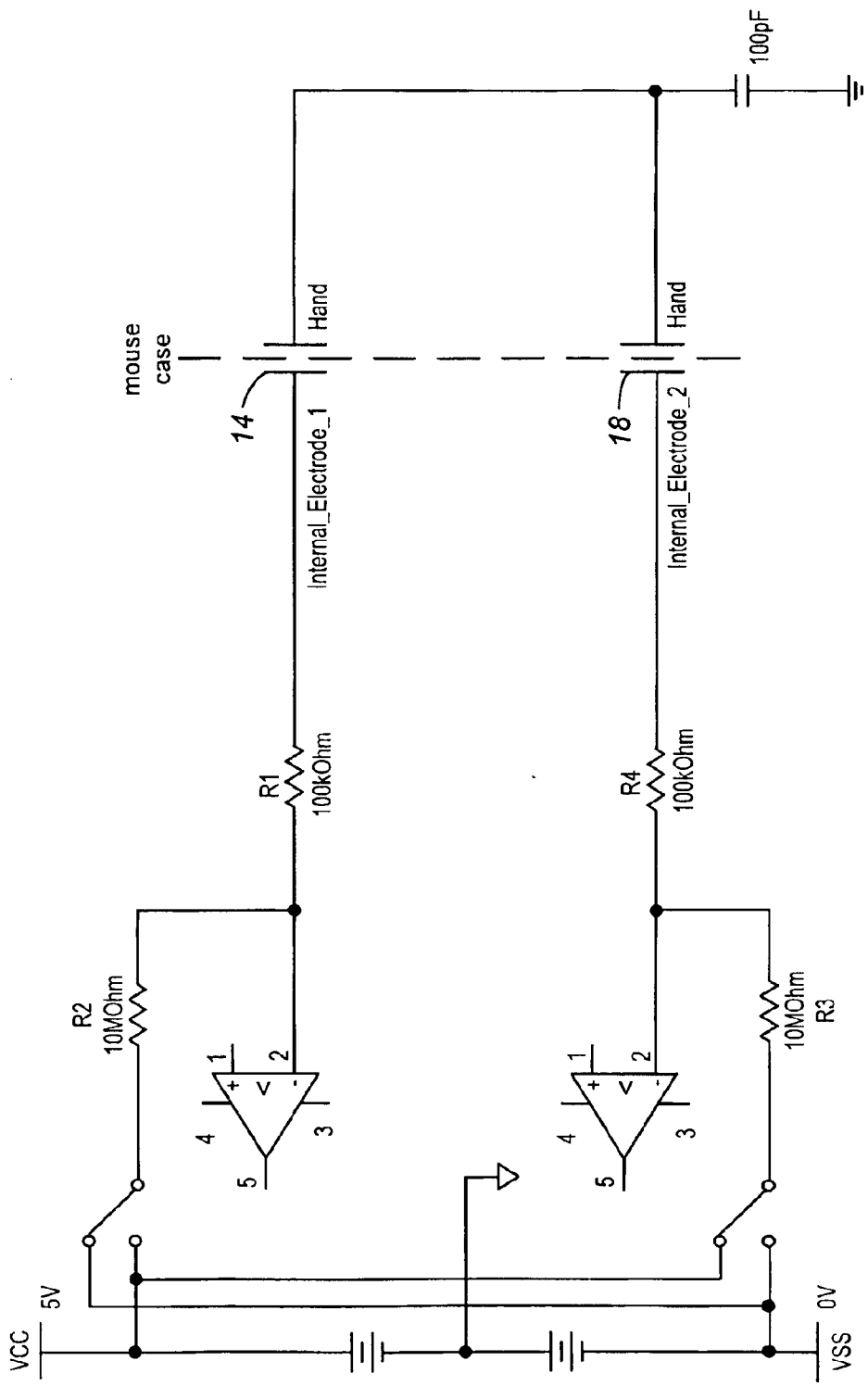

FIG. 2B illustrates the same circuit as FIG. 2A, except that instead of an exposed electrode directly contacted by the hand, there is a gap between electrodes 14 and 18 to the user's hand. This gap itself forms the desired measurement capacitance corresponding to capacitors 28 and 34 in FIG. 2A.

When the user is not placing his/her hand on the mouse, the capacitance is determined by the parasitic capacitor (a few pF) present on the measurement node. When the hand is located on the device, close to the parasitic capacitor, the overall capacitance is determined by a combined capacitor consisting of the parasitic capacitor and the measurement capacitor (28, 34).

The measurement capacitor models the capacitive coupling from the measurement node to local ground. It is connected to the measurement node on one end and to local ground via the user hand/body on the other end. It includes a coupling capacitor from inside the device to the hand, and a body-to-local earth capacitor, all connected in series. In one embodiment, the coupling capacitance is maximized by covering a large portion of the device surface, on the internal side, with an internal conductive layer, such as metal foil. It is the dominant term when compared to the other one (because it is the lowest value in the chain), on the order of 5 to 10 pF.

Since the device can be connected to a portable computer in one embodiment, and can be floating with respect to local earth, a virtual earth is generated inside the pointing device. This detection system relies on a double capacitance measurement, thus necessitating two charge/discharge-time-measurement circuits, each with its parasitic capacitor and internal conductive layer. In this configuration, one system measures its measurement node charging up, while the other measures its respective node charging down, and then the other way around in an alternated up/down manner. If the coupling from the two measurement nodes to local earth is symmetrical, the system ground is at a virtual earth.

The two parasitic capacitors are connected to an internal conductive layer, each covering a distinct portion of the internal surface, but close enough to produce a somewhat similar coupling to the hand resting over the device on the external surface. This enforces a rather symmetrical coupling if the entire hand covers the pointing device body, and allows virtual earth generation. In an alternate embodiment, the two internal conductive layers consist of two sets interleaved strips; each set being connected to its respective internal parasitic capacitor.

The hand detection circuit can be used both with the interrupt method and the monitoring method. In the interrupt method, the hand detection circuit operates in stand-alone mode by executing the capacitance measurements on a periodical time basis, for example every 500 ms. When a hand is detected, a signal at the output of the circuit and connected to the interrupt input of the pointing device microcontroller is asserted. Activating the interrupt input brings the device out of the idle state, which is then ready to operate.

In the monitoring method, the pointing device requests, on a periodical manner, capacitance measurements. If the output hand detector is asserted, the system resumes full power operation. If not, the system goes idle for a known duration after which a new capacitance measurement phase is requested.

Improved power saving and/or reduced latency time occurs when the energy to complete a full capacitance measurement is less than that of activity monitoring.

Due to the intrinsic lower energy requirement of a hand detection circuit, both a better trade-off between power saving and latency time; and an automatic power-on are possible. Examples of trade-offs include significant power saving with equivalent latency time, or moderate power saving together with a smaller latency time, while both options do not require any button clicking.

Figure 3:
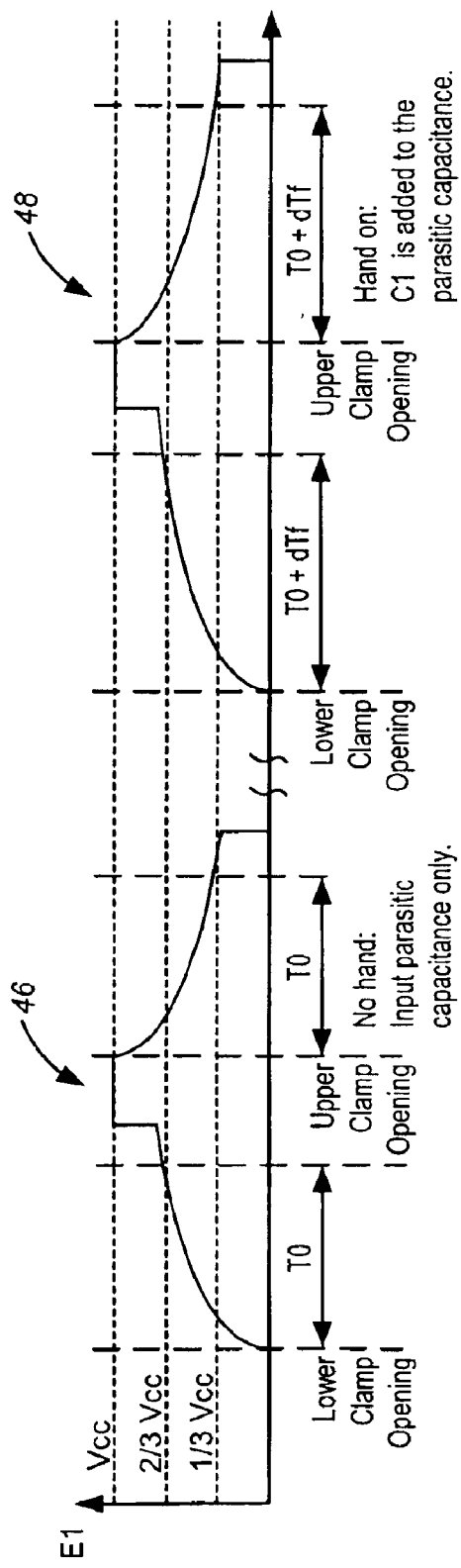
Figure 4:
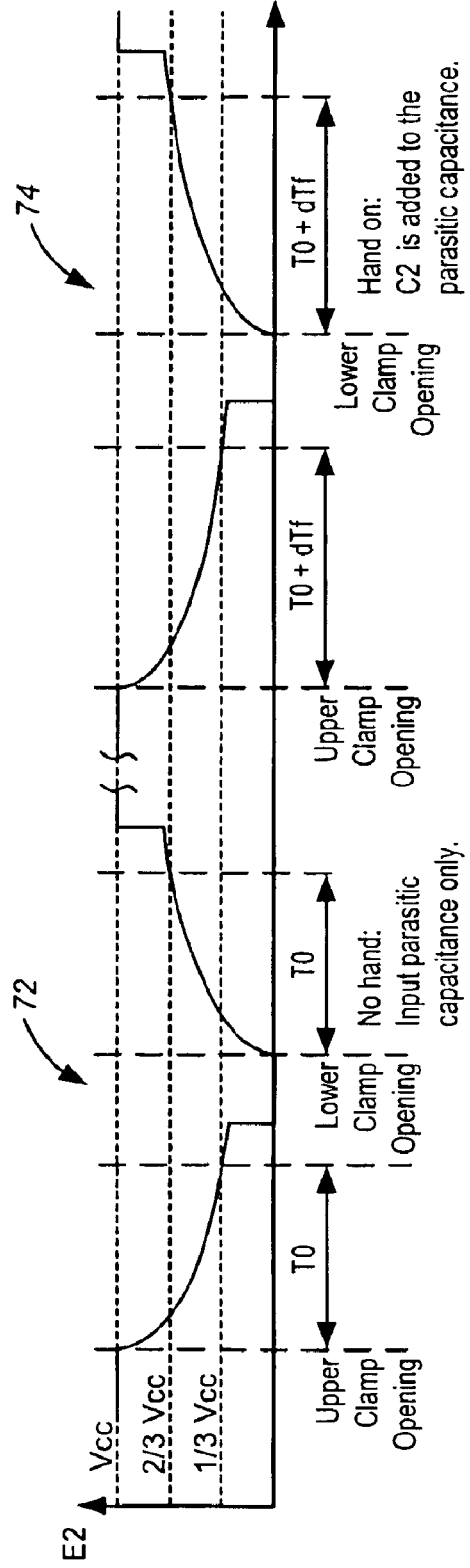

FIG. 3 shows a first signal waveform 46 with the charging and discharging times illustrated as times T0, with no hand present. The charging cycle charges up to the ⅔ Vcc threshold, while the discharging cycle discharges from Vcc down to a ⅓ Vcc threshold. A second waveform 48 illustrates the change in the charging time due the presence of the hand, indicated by dTf. Similar waveforms 72 and 74 are illustrated in FIG. 4 for the second electrode.

By adding the four measurements (the charge and discharge times of 48, and the charge and discharge times of 74), there is a cumulative change in capacitance of 4×dTf. Firmware embedded in the pointing device will compare that sum (both electrodes together) to a time reference in order to determine whether the hand is present or not. The threshold can be automatically readjusted each time after the hand was detected as touching the pointing device, or after it is detected as lifting off the pointing device. This will compensate for the parasitic capacitances (which do not vary depending on the hand being present or not). Thus, the system needs no factory adjustments. Preferably, the difference in capacitance is about between 1 and 4 pF. Less than 1 pF would risk having the system too sensitive, such that even vibrations of the electrode interconnections could be detected. 4 pF is about what is practical through the plastic case of a mouse.

If the input device is not referenced (not connected) to earth ground, any voltage may be present between the local voltage reference of the electronics and earth ground. This could lead to overflow or underflow of the counters in the controller for counting the charge and discharge times. By driving the two inputs in phase opposition, and connecting them to the same body capacitance, one circuit will try to discharge the body capacitance, while the other is trying to charge it, thus offsetting the body capacitance. This leaves the measurement capacitance on the two electrodes to be charged or discharged.

A push-pull configuration can also be used to measure the differential capacitance between the two electrodes, which augments when a common conductive element (the hand) is covering them both, whatever the potential of those elements may be versus the reference potential of the sensing circuitry.

Figure 5:
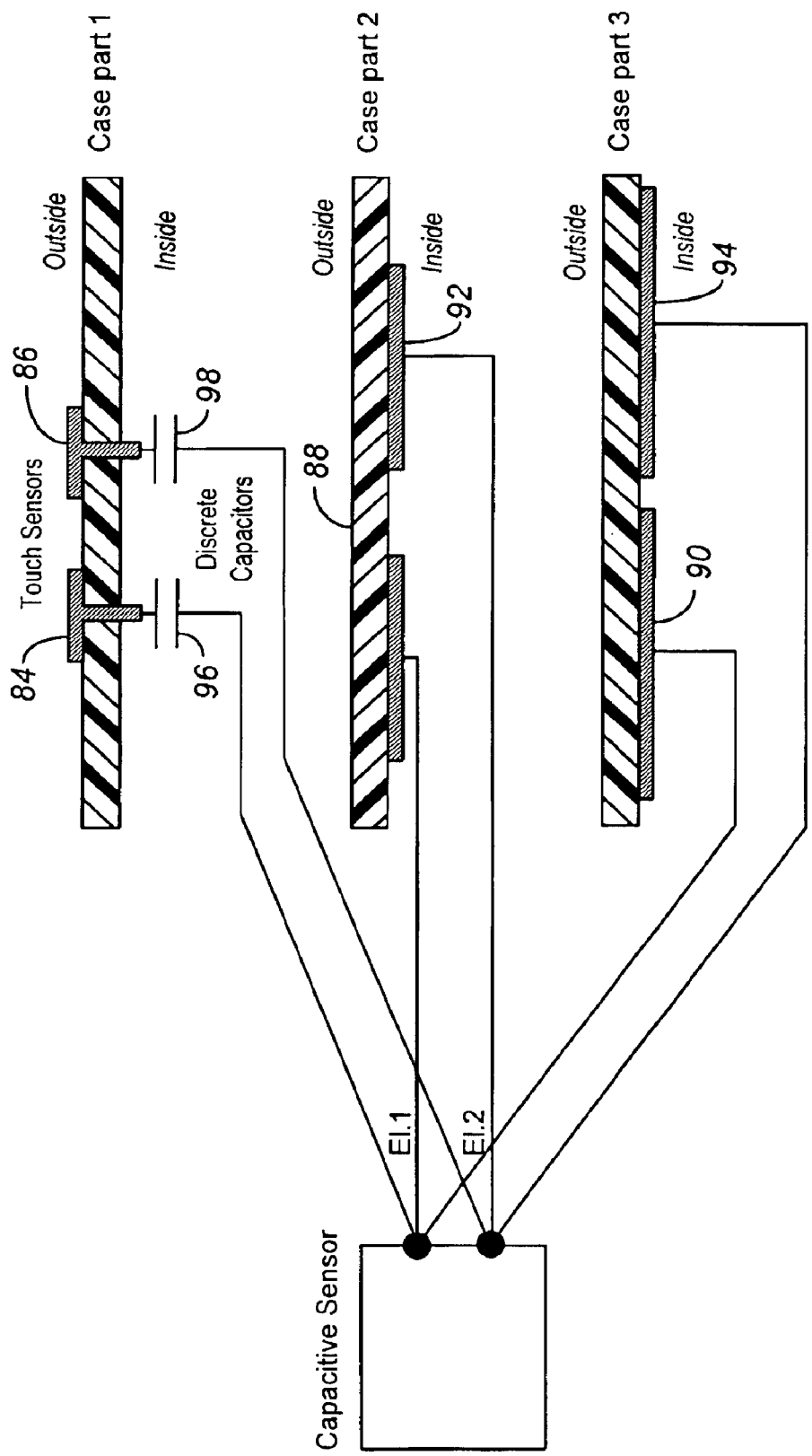
FIG. 5 is a diagram illustrating the use of both exposed electrodes on the side of a mouse and electrodes inside the top cover of a mouse in parallel.

FIG. 5 illustrates an embodiment in which both touch sensors in direct, galvanic contact with hand or fingers are wired in parallel with capacitive sensors mounted on the underside of a top case housing. In the example shown, two discrete electrodes 84 and 86 are exposed outside the case for direct contact with a user's finger. These may be close together on one side of the housing, or on opposite sides where they can be contacted by the grasping fingers of a user. Instead of simply two capacitive sensors on the inside of the top of a case, the diagram shows four interleaved sensors, with electrodes 88 and 90 being connected to a first electrode 84, and electrodes 92 and 94 being connected to a second electrode connected to electrode 86. External electrodes 84 and 86 require discrete capacitors, shown as capacitors 96 and 98. For the other electrodes (which are on the internal side of the case, i.e., not accessible to the user) the case itself provides the dielectric for capacitive coupling with the user's finger. This is a good embodiment for cost reasons, although it only allows a proximity detector instead of an actual-touch sensor.

Figure 6:
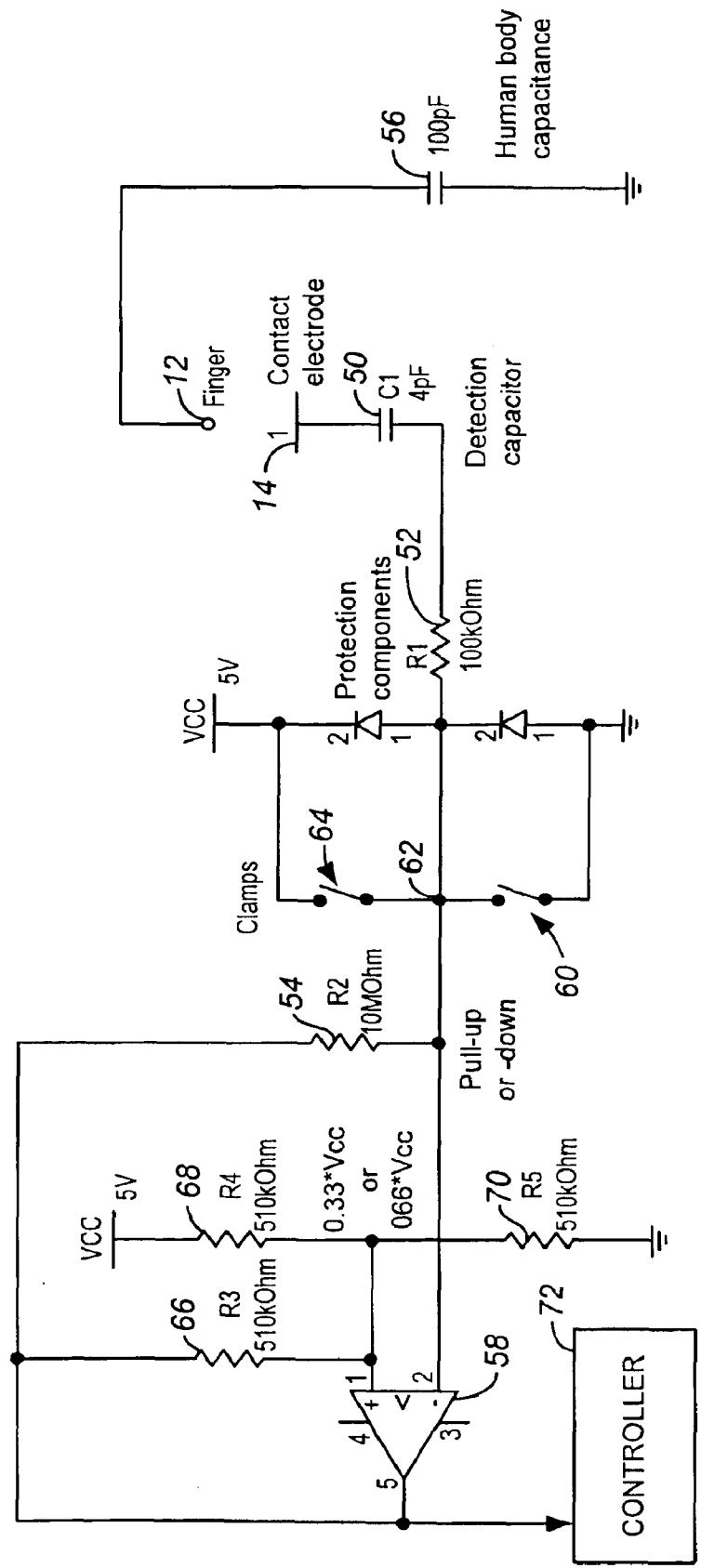
FIG. 6 is a more detailed circuit diagram of one embodiment of a capacitive detection circuit for one electrode according to one embodiment of the invention.

FIG. 6 is a block diagram of the capacitive detection circuit connected to each electrode. This embodiment shows a discrete capacitor (50, corresponding to capacitors 28 and 34 of FIG. 2A) that makes each external electrode an actual-touch sensor. In the example shown, an electrode 14 is connected to a sensing capacitor 50 and through a resistor 52 to a pull-up/pull-down resistor 54. In practice, the capacitor may be simply a gap in the wiring to the electrode. This gap can be created in a number of ways. A Mylar (Dupont's trademark for polyester foil) sheet can be used as a dielectric between the wiring connection and the electrode. This provides a well-characterized dielectric, with a well-characterized thickness, wedged between the conductor's terminal and the electrode, so that the resulting capacitance is well determined in spite of differences in tolerances during manufacturing. A flexible PC board could be used, with the flexible substrate itself causing the gap, i.e. the dielectric, between the electrode and the wiring. In one embodiment, the gap is about 50 microns, although the gap used can vary widely depending on the dielectric, etc. In one embodiment a wire is simply not stripped after it is cut, leaving its insulation intact up to the end. Then it is inserted through a hole in the electrode that has the same diameter as the insulation's external diameter. Or the electrode may be made of two pieces that are assembled around the insulated wire so that this is surrounded by the electrode. This makes a cylindrical or tubular capacitor at no material cost, where the wire jacket is the dielectric.

When the finger 12 makes contact with electrode 14, the body capacitance 56 is placed in series with the detection capacitance 50 and resistor 52. When a galvanic contact is made between the finger and the contact electrode, the amount of the capacitance is measured at an input to comparator 58 by measuring the amount of time to either charge up or discharge the capacitance. In the embodiment shown, a switch 60 is closed to connect a node 62 to ground, allowing a measurement of the amount of time for the capacitance to discharge. Subsequently, a switch 64 can close, and switch 60 open, to measure the amount of time for the capacitance to charge from the power supply. These charge up and charge down times are illustrated in FIGS. 3A and 3B, with T0 being the amount of time in the absence of a finger. The presence of a finger is indicated by dTf. Additional noise cancels out between the charge up and charge down cycles.

The threshold on the other input of comparator 58 is set by feedback from its output through a resistor 66, in combination with a voltage divider of resistors 68 and 70. The output of comparator 58 will alternate between a 0 and 1 value, causing the threshold to alternate between 0.33 and 0.66 of the supply voltage, Vcc. For more details about the construction and operation of a capacitive detection circuit, reference should be made to copending patent application Ser. No. 60/258,133, filed Dec. 22, 2000, entitled "Pointing Device with Solid State Roller," assigned to the same Assignee as this application, the disclosure of which is hereby incorporated by reference.

The output of comparator 58 is provided to a controller 72. The controller also controls the opening and closing of clamp switches 60 and 64. The controller can also analyze the signal from the electrode, and a separate signal from a similar circuit for a second electrode, to determine the presence of a finger and the movement direction of a hand.

Figure 7:
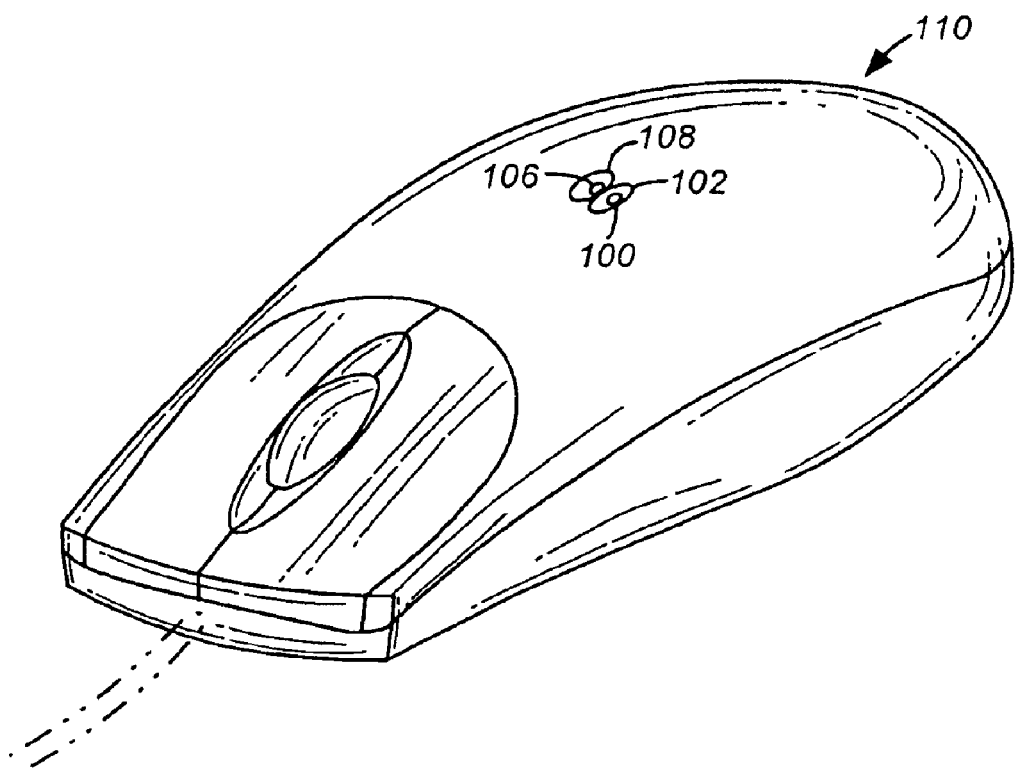
FIG. 7 is a perspective view of an alternate embodiment of hand detection on a mouse using optical detection.

FIG. 7 is a perspective view of an alternate embodiment of the invention using optical detection. A light emitter 100 is mounted in a recess 102, adjacent a photodetector 106 mounted in a recess 108 of the top housing of a mouse 110. Light reflected off an approaching hand can be detected to activate the mouse. Similarly, the absence of such a reflection can be used to turn off the mouse. Such optical detection allows detection of the hand before it actually touches (or come very close to) the case. In one embodiment, the range is about 2 to 3 inches, but may even be extended further should it be beneficial. The range is determined by the fact that the light is emitted in a cone, so that the farther away the hand is, the less light is reflected back to the photodetector. A combination of controlling the angle of the cone of emitted light and the detection threshold can be used to control the range. The fact that the hand is detected sooner allows a reduction in the check rate (how often the circuitry is turned on to check for a hand) compared to capacitive contact detection. Thus the power dedicated to the hand detection may be reduced further while keeping the same overall reaction time.

In one embodiment, only two op-amps are used for all the high gain (60 dB) and steep band pass filtering. Filtering is done around a pass band centered on 20 KHz. The circuit basically sends very short unique light pulses from time to time (typ. 100 to 200 ms) in order to save as much energy as possible. Then it analyses the level of light received in return. An artificial light rejection algorithm is used to eliminate triggering due to ambient light in the absence of a hand. If the initial received level of light is high enough to maybe be the reflection on a hand, a further measurement is done but, this time, without light emitted: if the level is high again, this was not a hand, therefore the system is not awakened and a new 100 to 200 ms idle period is entered. In one embodiment, if an initial hand detection is indicated, this is confirmed before activating the mouse by providing several successive measurement cycles with and without emitted light (typ. up to 15). This sequence is interrupted if any subsequent measurement indicates that no hand was responsible for the first high level of light observed. Then, only if the whole series of cycles is successfully achieved (15 high light levels, 15 low light levels observed) is the hand declared present and therefore the mouse awakened. In alternate embodiments, the number of measurements and the number required for turning on the mouse could be varied. Alternately, the frequency of the multiple measurements could be varied to avoid synchronization with an ambient light source, such as 50/60 Hz fluorescent lights and their higher frequency harmonics.

Further rejection (in fact reset after time-out) algorithms are provided for not keeping awake a mouse that is inadvertently covered by a piece of paper or other reflective obstacle for a long time. In one embodiment, if no button click or mouse or roller movement is detected for 5 minutes, the mouse is turned off on the assumption that something other than a hand is causing the reflection. After a hand has been detected, the turning on and off of the light emitter to detect the removal of a hand can be at a slower rate to save power. In one embodiment, the emitter is pulsed at 10 Hz before a hand is detected, and at 1 Hz after a hand detection. Thus, if a user removes his/her hand for 5 seconds, the mouse will turn off after the first second, and save power for 4 seconds of off time.

In one embodiment, an infrared (IR) light emitter is used. IR provides sufficient reflection off skin, and also is not visible. Alternately, other wavelengths, such as red, may be used. In one embodiment, IR emitters with a 30 degree cone of emission are used. The emitter is separated from the photodetector by less than 2 cm., in one embodiment 1 cm. In one embodiment, a black, dark red, or smoked window is placed over the emitter and detector to hide the electronics, while being substantially transparent to IR light.

Figure 8:
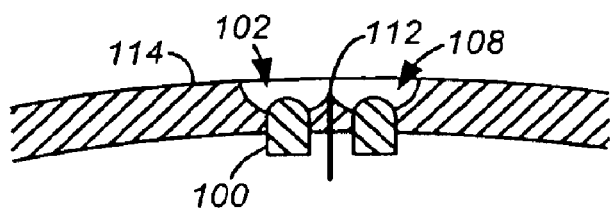
FIG. 8 is a section view showing the optical detector of FIG. 7 in more detail.

As shown in FIG. 8, emitter 100 is below the top surface 114 of the mouse, so that light does not shunt between the emitter and detector directly to cause a false signal. Recesses 102 and 108 provide a gap between them allowing reflected light to pass when the hand is on the mouse, flush with the top surface 114, and would otherwise block light from reaching the detector. A shunt barrier 112 is provided to insure that there is not direct transmission of light to the detector through the recesses. Barrier 112 is preferably metal, such as aluminum, or some other material which is more opaque to IR light than the plastic material of the mouse housing. The emitter and detector need not be completely parallel, in one embodiment they are mounted to both point at the same point about 2 to 3 inches above the mouse housing. The distance of 2 to 3 inches is approximately the length of typical human fingers, so that if the mouse is grasped with the tip of the fingers, with the palm above the mouse, the palm should be within 2 to 3 inches. If the emitter and detector are mounted closer together, they can be closer to parallel. Additionally, the angle of divergence of the cone of light may be sufficient to provide a reflection can be detected even if the emitter and detector are mounted parallel to each other.

As will be understood by those of skill in the art, the present invention may be embodied in other specific forms without departing from the essential characteristics thereof. For example, instead of variation of capacitance or reflections of a light emitted from the top of the mouse case off a hand, any other type of hand detection could be used, such as reflections of ultrasound, reflections of a RF signal (RADAR), self emission of long-wave infrared by the hand (Pyroelectric detection), absorption of ultra high frequency radio signal by the hand, variation of force/pression exerted on the device's case, etc. Also, instead of being a pointing device connected to a computer, the input device could be a remote control for controlling a TV or a stereo, or any other electronic equipment. The technique of the invention can also be applied to a gaming device. In particular, hand detection is useful for force-feedback joysticks where a "dead-man switch" has to be implemented in order to prevent the handle from moving when no hand is grasping it. Accordingly, the foregoing description is intended to be illustrative, but not limiting, of the scope of the invention which is set forth in the following claims.

What is claimed is:

1. An input device comprising:

a housing;

electronic circuitry for detecting user inputs and transmitting signals corresponding to said inputs to an electronic device;

a sleep-mode circuit, coupled to said electronic circuitry, for activating a reduced power operation of said electronic circuitry;

a capacitive hand detection circuit for detecting the proximity of a user's hand to said housing and producing a hand detect signal; and said sleep mode circuit being responsive to said hand detect signal to awaken said electronic circuitry from said reduced power operation;

wherein said hand detection circuit is mounted inside a ton of said housing, such that a portion of said housing insulates said user's band from said capacitive hand detection circuit;

wherein said capacitive detection circuit comprises first and second electrodes on said housing for capacitive connection with a user's hand;

a first circuit, coupled to said first electrode, for determining an amount of time for charging of a capacitance connected to said first circuit; and a second circuit, coupled to said second electrode, for determining an amount of time for discharging of a capacitance connected to said second circuit;

such that an internal virtual ground is produced between said first and second electrodes; and wherein said first circuit comprises;

a comparator;

a controller coupled to an output of said comparator;

a voltage divider feedback circuit coupled between an output and a reference voltage input of said comparator;

a detection capacitor coupled between said first electrode and a signal input of said comparator; and a switching circuit selectively coupling said signal input of said comparator to high and low voltage supplies.

2. An input device comprising:

a housing;

electronic circuitry for detecting user inputs and transmitting signals corresponding to said inputs to an electronic device; and an optical hand detection circuit for optically detecting the proximity of a user's hand to said housing and producing a hand detect signal;

a controller for turning on and off a light emitter, and providing said hand detection signal only after a predetermined number of on cycles provides a reflection to said detector above a threshold, wherein said controller further:

filters ambient light frequencies different from a frequency of said light emitter;

cycles said light emitter on and off at a first rate before a hand detection, and at a second rate after a hand detection; and requires detection of a hand for a predetermined number of cycles before issuing said hand detect signal.

3. The input device of claim 2 wherein said controller removes said hand detect signal in the absence of a control input to said input device for a predetermined amount of time after a detection of a hand.

4. The input device of claim 2 wherein said input device is a mouse.

5. The input device of claim 2 further comprising:

a sleep-mode circuit, coupled to said electronic circuitry, for activating a reduced power operation of said electronic circuitry, said sleep mode circuit being responsive to said hand detect signal to awaken said electronic circuitry from said reduced power operation.

* * * * *

UNITED STATES PATENT AND TRADEMARK OFFICE
CERTIFICATE OF CORRECTION

PATENT NO. : 6,859,196 B2
DATED : February 22, 2005
INVENTOR(S) : Kehlstadt

It is certified that error appears in the above-identified patent and that said Letters Patent is hereby corrected as shown below:

<u>Column 8,</u>
Line 50, correct "ton" to -- top --.
Line 51, correct "band" to -- hand --.

Signed and Sealed this

Third Day of January, 2006

JON W. DUDAS
*Director of the United States Patent and Trademark Office*